United States Patent [19]

Vilzmann et al.

[11] Patent Number: 5,578,123
[45] Date of Patent: Nov. 26, 1996

[54] APPARATUS AND METHOD FOR PREPARING A SINGLE CRYSTAL

[75] Inventors: Peter Vilzmann, Burghausen; Helmut Pinzhoffer, Tann, both of Germany

[73] Assignee: Wacker Siltronic Gesellschaft für Halbleitermaterialien AG, Munich, Germany

[21] Appl. No.: 541,341

[22] Filed: Oct. 10, 1995

[30] Foreign Application Priority Data

Dec. 1, 1994 [DE] Germany ............................ 44 42 829.4

[51] Int. Cl.$^6$ ...................................................... C30B 15/20
[52] U.S. Cl. ................. 117/13; 117/34; 117/222
[58] Field of Search .............................. 117/13, 19, 34, 117/217, 222, 900

[56] References Cited

U.S. PATENT DOCUMENTS

| | | | |
|---|---|---|---|
| 4,330,361 | 5/1982 | Kuhn-Kuhnenfeld et al. | 117/217 |
| 4,330,362 | 5/1982 | Zulehner | 117/33 |
| 4,956,153 | 9/1990 | Yamagishi et al. | 117/217 |
| 5,152,867 | 10/1992 | Kitaura et al. | 117/217 |
| 5,361,721 | 11/1994 | Takano et al. | 117/217 |
| 5,363,796 | 11/1994 | Kobayashi et al. | 117/217 |

FOREIGN PATENT DOCUMENTS

| | | |
|---|---|---|
| 0340941 | 11/1989 | European Pat. Off. . |
| 0608875 | 8/1994 | European Pat. Off. . |

*Primary Examiner*—R. Bruce Breneman
*Assistant Examiner*—Felisa Garrett
*Attorney, Agent, or Firm*—Collard & Roe, P.C.

[57] ABSTRACT

Apparatus for preparing a single crystal made of silicon is according to the Czochralski method, which includes a tubular to the conical body which shields the growing single crystal and divides the receiver chamber above the melt into an inner portion and an outer portion, the body having at least one orifice through which inert gas which is conducted into the inner portion of the receiver chamber is able to pass directly into the outer portion of the receiver chamber. The method for preparing a single crystal made of silicon is in accordance with the Czochralski method, wherein a portion of an inert gas stream is conducted through at least one orifice in the tubular to conical body from the inner portion into the outer portion of the receiver chamber.

4 Claims, 6 Drawing Sheets

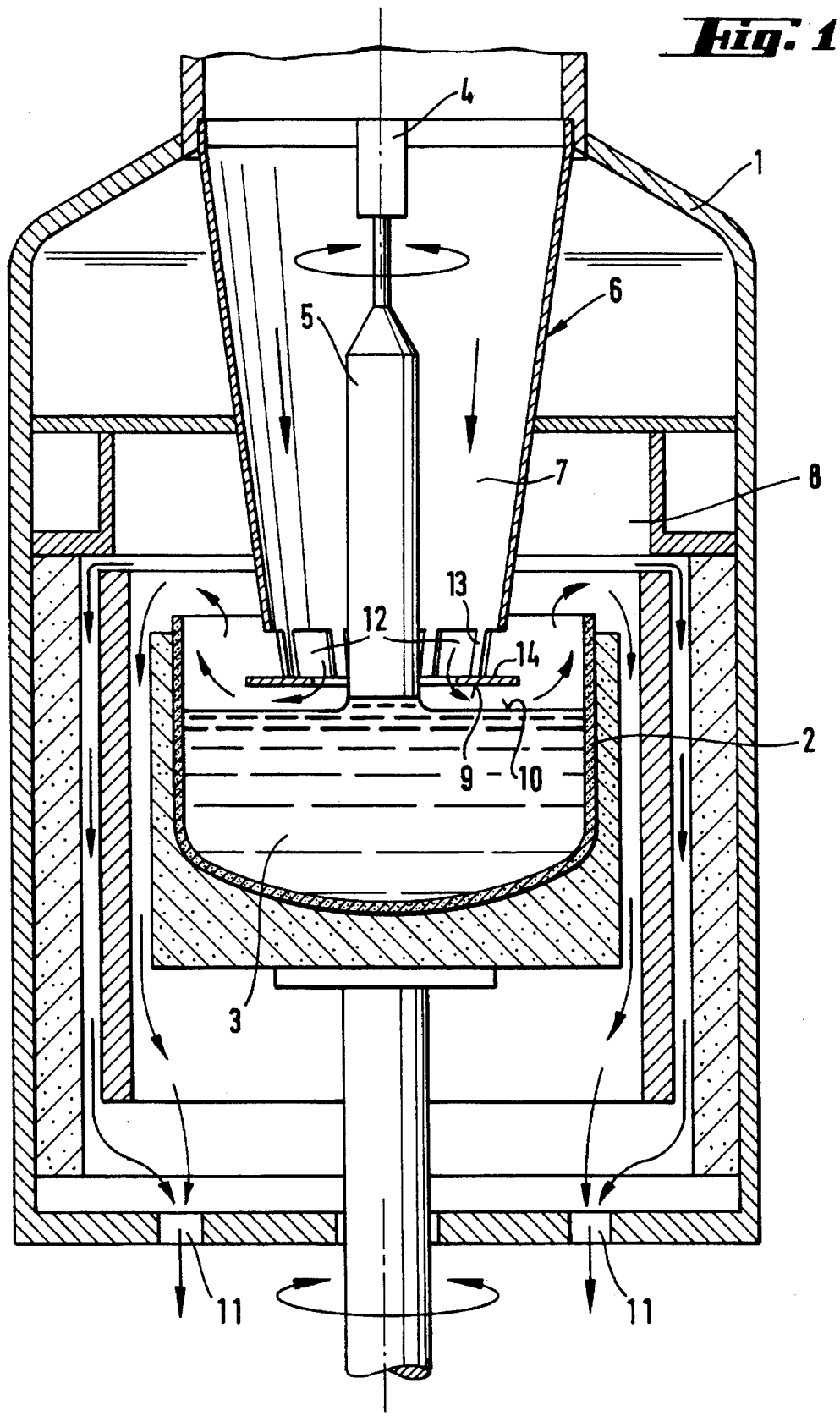

APPARATUS AND METHOD FOR PREPARING A SINGLE CRYSTAL

BACKGROUND OF THE INVENTION

1. Field of the Invention

The present invention relates to an apparatus and a method for preparing a single crystal made of silicon in accordance with the Czochralski method. An essential feature of this method is that a monocrystalline seed crystal in a receiver sealed off from the environment is brought into contact with molten material provided in a crucible and is pulled away from the melt at a certain rate, a single crystal starting to grow in the process at the underside of the seed crystal.

2. The Prior Art

Many pulling apparatuses are equipped with a tubular to conical body which shields the growing single crystal. The U.S. Pat. No. 4,330,362 describes a body which shields the single crystal and tapers conically toward the melt, having a cup-like appearance as a result. Such bodies which concentrically enclose the growing single crystal over its entire length or part thereof screen off heat radiation emanating from the crucible wall. One consequence of this is that the single crystal can be pulled at a higher rate.

While a single crystal is being pulled, silicon monoxide is being formed continuously, which escapes as a gas into the receiver chamber above the melt. The receiver is purged with inert gas to prevent the silicon monoxide from being deposited as a solid on cold parts in the crucible region of the pulling apparatus, from reaching the crystallization front at the single crystal and from causing dislocations in the crystal. Customarily, inert gas is conducted toward the surface of the melt and, together with silicon monoxide formed, is exhausted from the receiver. A body shielding the single crystal divides the receiver chamber above the melt into an inner and an outer portion. An inert gas stream for removing silicon monoxide is conducted, as a rule, through the inner portion of the receiver chamber toward the surface of the melt. It then passes, between the lower end of the shielding body and the surface of the melt, into the outer portion of the receiver chamber and finally to an exhaust port provided in the receiver wall.

When crystals doped with antimony or arsenic are prepared, the striking fact emerges that certain product specifications requiring a high dopant content in the single crystal are virtually unattainable or are attainable only with a very low yield. Incorporation of dopant in high concentrations becomes the more difficult, the larger the diameter of the growing single crystal. The vapor pressure of these dopants in liquid silicon is fairly high, so that the melt is rapidly depleted of dopant. Attempts have therefore been made to supersaturate the melt with dopant in order to circumvent a dopant deficiency. Unfortunately, such measures promote the formation of dislocations in the single crystal, which then has to be melted back in a time-consuming procedure, before pulling can continue. In the meantime, as a rule, so much dopant will have left the crucible that the demanded rate at which the dopant is to be incorporated into the crystal lattice can no longer be achieved.

SUMMARY OF THE INVENTION

It is an object of the present invention to improve the preparation of single crystals made of silicon in accordance with the Czochralski method in such a way that even single crystals with a high arsenic or antimony content can be prepared without difficulties and in good yields.

The present invention relates to an apparatus for preparing a single crystal made of silicon according to the Czochralski method, essentially comprising a receiver which can be purged with inert gas, a crucible accommodated therein for holding a melt, a device for pulling a single crystal from the melt and a tubular to conical body which shields the growing single crystal and divides the receiver chamber above the melt into an inner portion and an outer portion, inert gas which is conducted into the inner portion of the receiver chamber toward the melt passing between the lower end of the body and the surface of the melt into the outer portion of the receiver chamber, wherein the body has at least one orifice through which inert gas is able to pass directly from the inner portion into the outer portion of the receiver chamber.

The invention also relates to a method for preparing a single crystal made of silicon in accordance with the Czochralski method, which involves a single crystal being pulled in a receiver from a melt provided in a crucible, the single crystal being surrounded by a tubular to conical body which shields it and divides the receiver chamber above the melt into an inner portion and an outer portion, and an inert gas stream being conducted through the inner portion of the receiver chamber toward the surface of the melt and between the lower end of the body and the surface into the outer portion of the receiver chamber, wherein a portion of the inert gas stream is conducted through at least one orifice in the body from the inner portion directly into the outer portion of the receiver chamber.

Surprisingly, the modifications proposed in the method and the apparatus are sufficient to circumvent the difficulties encountered hitherto in the preparation of single crystals which are made of silicon and are highly doped with antimony or arsenic. The invention is particularly advantageous for the preparation of single crystals having diameters above 100 mm, since the melt from which the single crystal is pulled need not, as has been the case hitherto, be concentrated with dopant beyond the saturation level. Moreover, it should be noted that the method also affects the incorporation of oxygen into the single crystal and is therefore of general significance for the preparation of single crystals made of silicon. This additional effect is independent of the type and the amount of deliberately introduced dopants and equally occurs, for example, in the case of doping with boron or phosphorus. It manifests itself in that the oxygen content measured in the finished single crystal varies as a function of the number and the size of the orifices in the body shielding the single crystal. It is possible both to influence the absolute amount of oxygen absorbed by the single crystal and the axial profile of the oxygen concentration in the single crystal. Thus, for example, an oxygen concentration can be achieved which decreases to a greater or lesser extent from the tip to the end of the single crystal.

One possible explanation for the fact that the invention simplifies above all the preparation of single crystals made of silicon and doped with antimony and arsenic is that there is a beneficial effect on the flow conditions in the gas space above the surface of the melt.

BRIEF DESCRIPTION OF THE DRAWINGS

Other objects and features of the present invention will become apparent from the following detailed description considered in connection with the accompanying drawing which discloses two embodiments of the present invention. It should be understood, however, that the drawing is designed for the purpose of illustration only and not as a definition of the limits of the invention.

In the drawings, wherein similar reference characters denote similar elements throughout several views.

DETAILED DESCRIPTION OF PREFERRED EMBODIMENTS

Figure 1A:
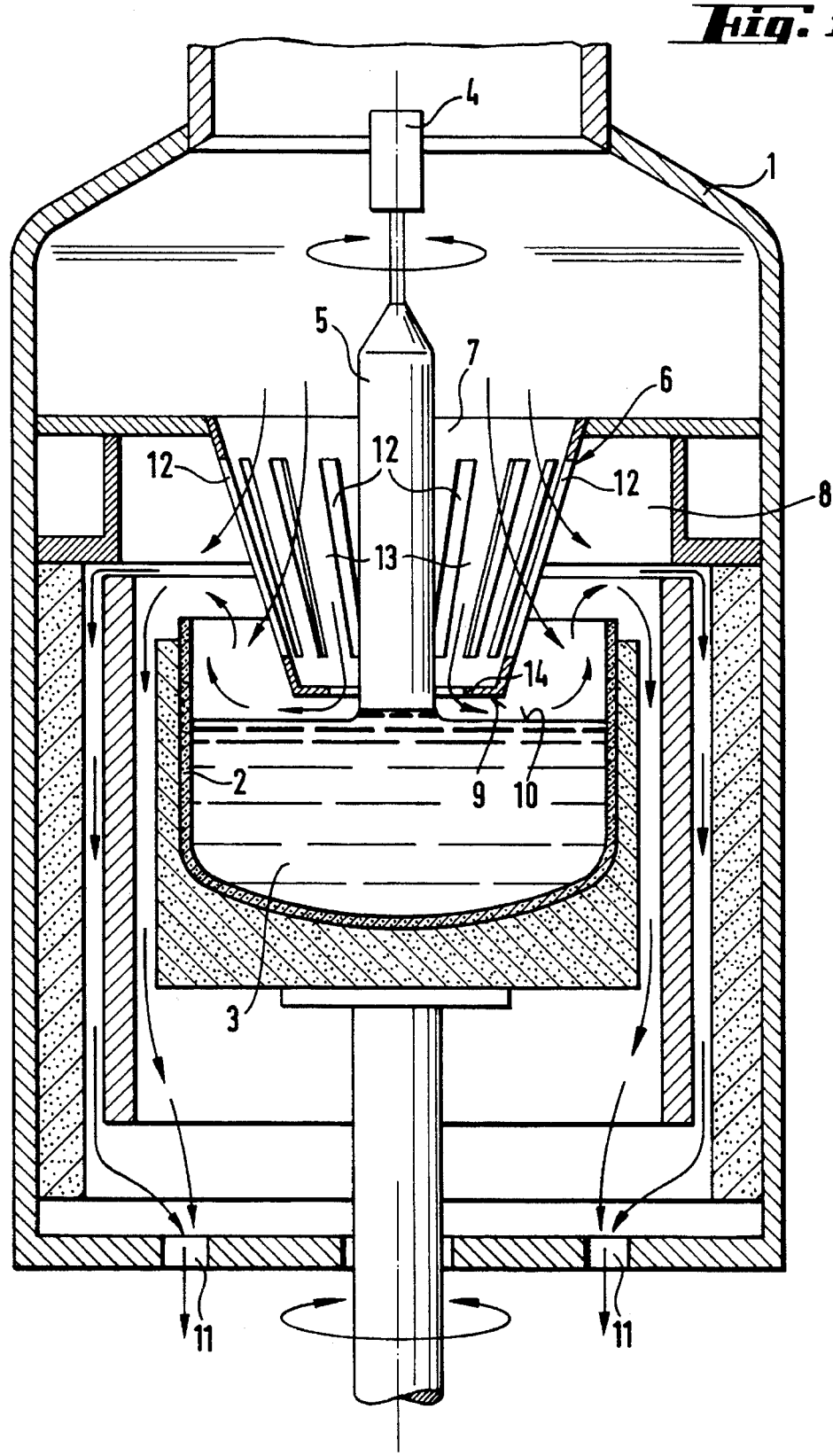
FIGS. 1a)–1d) in each case show a longitudinal section through an apparatus for preparing single crystals in accordance with the Czochralski method.
Figure 1B:
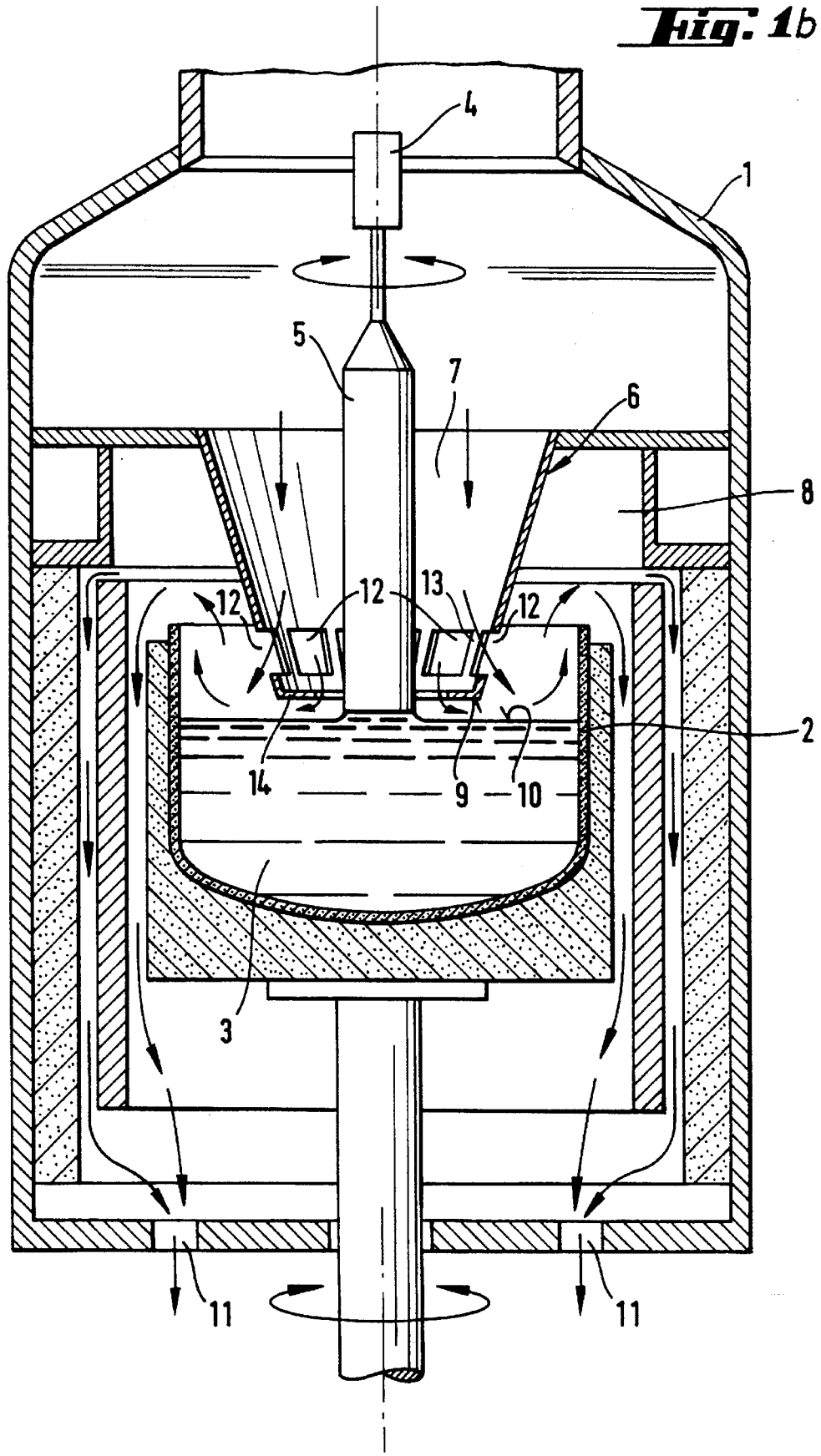
Figure 1C:
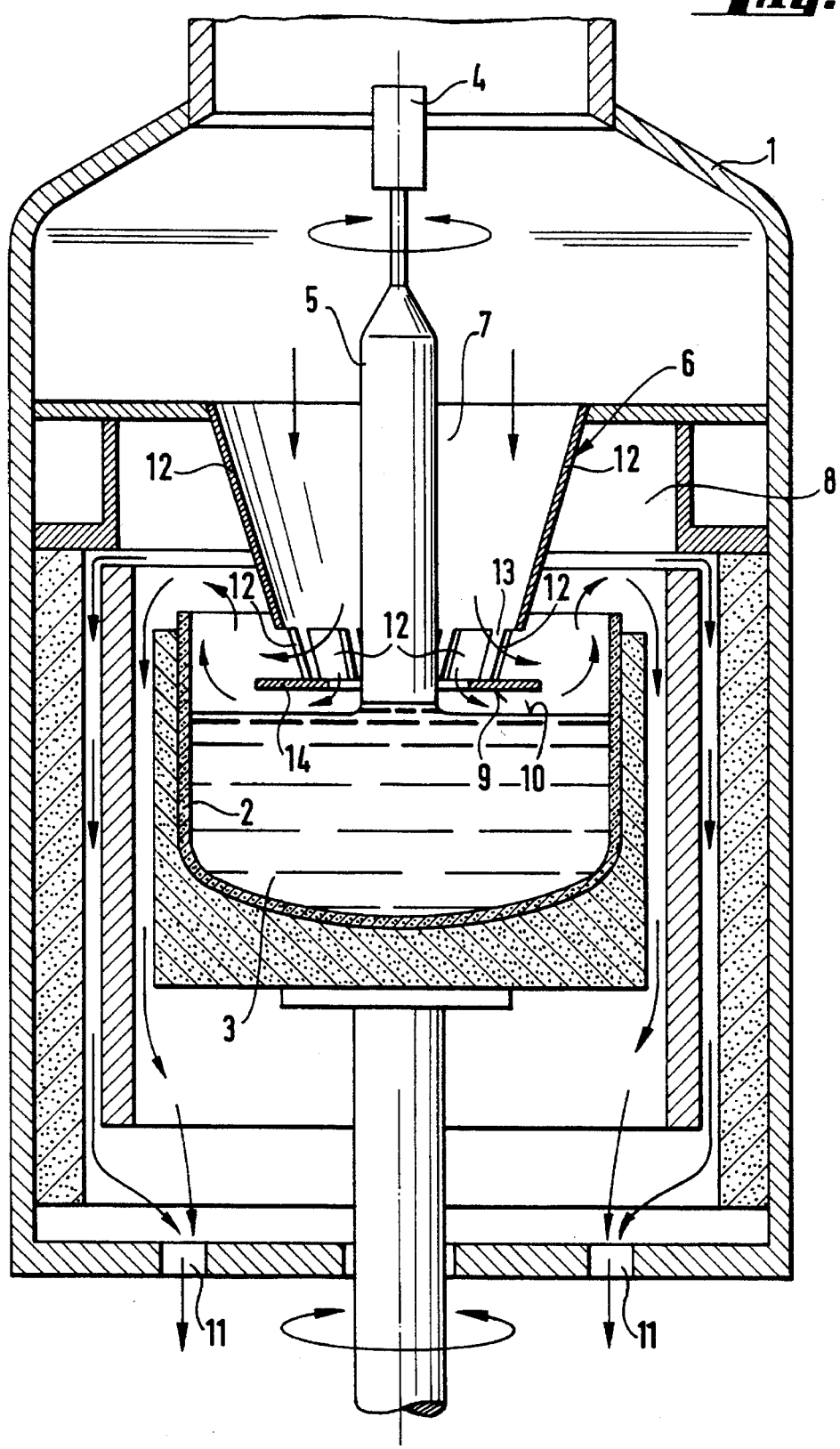

Reference is made to FIGS. 1a)–1d). The apparatus according to the invention comprises a receiver 1 which accommodates a crucible 2 filled with molten silicon and optionally added dopant. From the melt 3 a single crystal 5 is pulled with the aid of a pulling device 4. The single crystal is enclosed by a rotationally symmetric body 6 which shields it and divides the receiver chamber above the melt into an inner portion 7 and an outer portion 8. The distance between the lower end 9 of the body and the surface 10 of the melt is preferably from 5 to 50 mm, so that inert gas which, as indicated by arrows in the FIGS. 1a)–1d), is conducted into the inner portion 7 of the receiver chamber, can pass through the gap between the lower end 9 of the body and the surface 10 of the melt into the outer portion 8 of the receiver chamber. The further route of the inert gas stream from the outer portion 8 of the receiver chamber as far as one or more exhaust ports 11 in the wall of the receiver is likewise indicated by arrows. The body 6 which yields the single crystal may have a tubular or conical shape.

In the case of a conical body, the distance between the single crystal and the inner wall of the body continues to decrease as the single crystal approaches the lower end of the body in the case of a tubular body this distance remains constant over the entire height of the body. The height of the body is of minor importance in connection with the present invention, always assuming that a certain minimum height is exceeded and precautions have been taken to ensure that the particularly hot zones of the growing single crystal are screened off by the body. For example, the body 6 depicted in FIG. 1d) extends from the upper demarcation of the receiver 1 right into the crucible 2. According to the present invention, that wall of the body which surrounds the single crystal is not entirely closed but has at least one orifice 12 through which the inert gas stream being conducted into the inner portion of the receiver chamber to the surface 10 of the melt passes, in part directly, into the outer portion 8 of the receiver chamber. Based upon the total area of the orifice, it is possible to set a specific division ratio, by which the inert gas stream is divided into substreams which leave the inner portion 7 of the receiver chamber in different ways.

Preferably, the substream which flows through the orifice 12 in the body 6 should pass with a radially uniform distribution into the outer portion of the receiver chamber. Thus, a plurality of orifices, for example drilled holes, may be provided equidistantly on a perimeter of the body. According to the embodiment shown in FIG. 1a), the orifice 12 in the body 6 comprises a multiplicity of slots which are arranged at regular spacings around the circumference of the body.

Figure 2A:
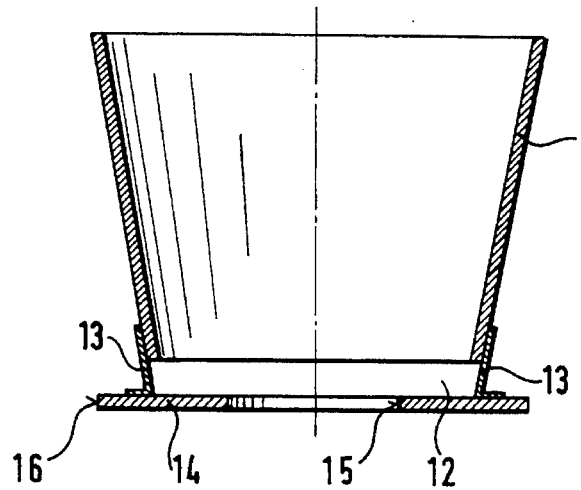
FIGS. 2a)–2h) show longitudinal sections through preferred embodiments of the body shielding the single crystal.
Figure 2B:
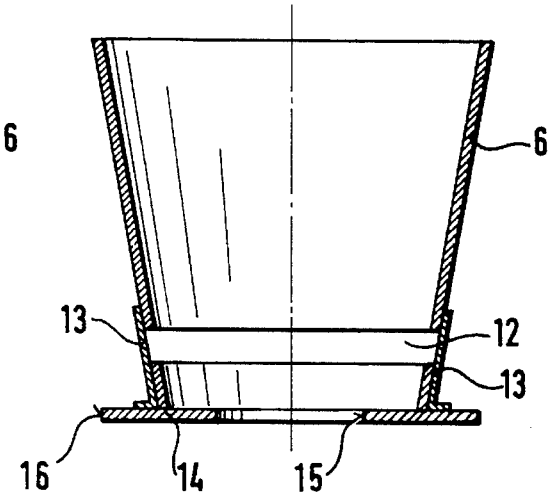

Particularly preferred embodiments of the body shielding the single crystal are shown in the FIGS. 2a)–2h). The orifice body, as proposed here, takes the form of a slot 12 which follows a perimeter of the body and which is broken only by attachment struts 13 which support the lower portion of the body. Alternatively, two or more slots arranged above one another can be provided. The preferred slot width is from 5 to 50 mm. The body shielding the single crystal is delimited at its lower end by a screen 14 which is preferably fashioned as an annulus and is spaced parallel to the surface of the melt. The embodiments according to FIGS. 2a), 2d), 2e), and 2h) differ from the other embodiments shown in terms of the position of the slot 12 relative to the surface of the screen. In the case of the first-mentioned embodiments of FIGS. 2a), 2d), 2e), and 2h) the body's lower portion retained by attachment struts is formed solely by the screen. In the case of the remaining embodiments, FIGS. 2b), 2c), 2f), and 2g), the body's lower portion retained by attachment struts comprises the screen 14 and a part, resting thereon, of the cylindrical or conical wall of the body.

Figure 2C:
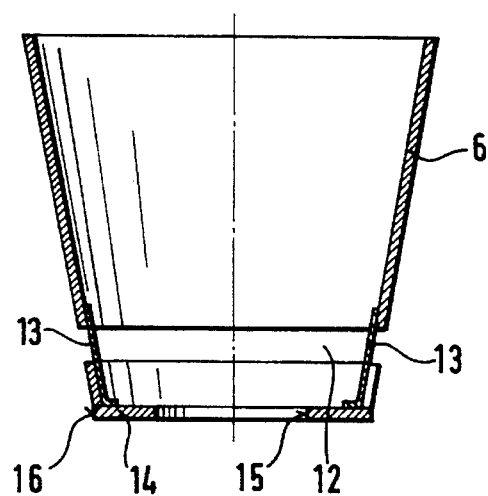
Figure 2D:
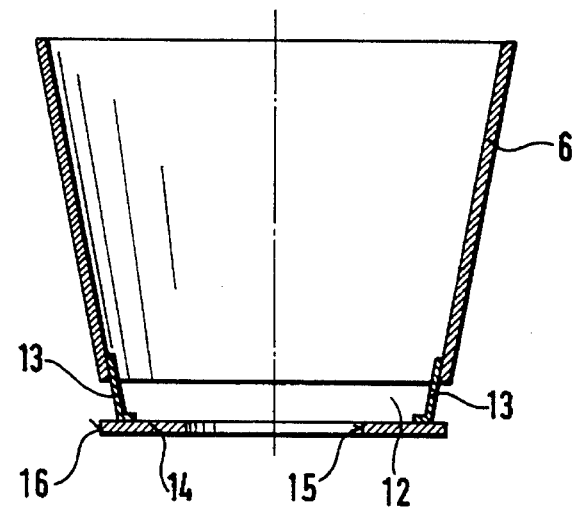
Figure 2E:
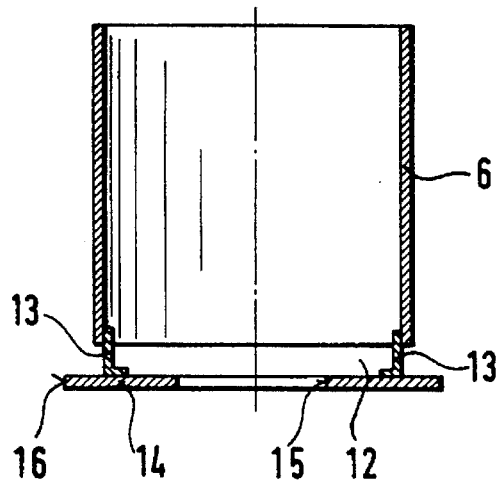
Figure 2F:
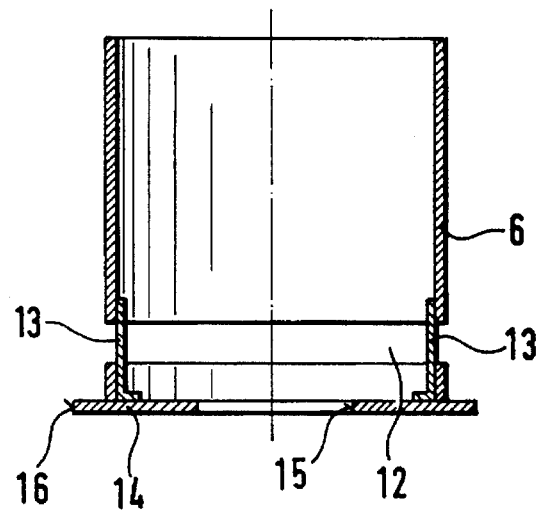
Figure 2G:
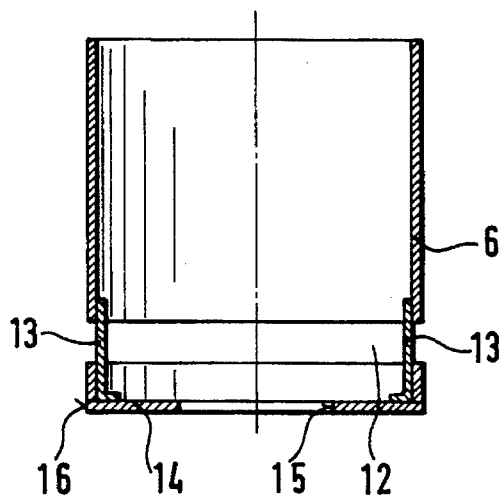
Figure 2H:
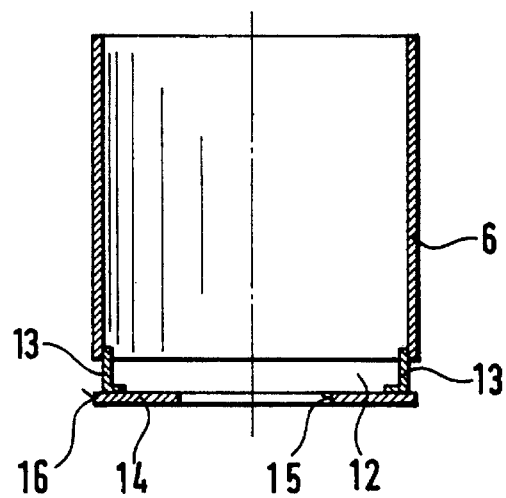

By virtue of the design of the screen 14 it is additionally possible to influence the flow conditions in the receiver chamber above the melt. Preferably, the inner rim 15 of the screen projects into the inner portion of the receiver chamber and extends toward the single crystal from 10 to 80 mm. The outside diameter of the screen may be chosen in such a way that the screen projects, with its outer rim 16, into the outer receiver chamber and extends toward the inner wall of the crucible by, for example, from 10 to 80 mm. The outside diameter of the screen should not, however, be chosen smaller than the outside diameter of the cylindrical or conical portion of the body which rests on the surface of the screen (embodiments according to FIGS. 2c) and 2g)) or points toward said surface (embodiments according to FIGS. 2d) and 2h)).

While several embodiments of the present invention have been shown and described, it is to be understood that many changes and modifications may be made thereunto without departing from the spirit and scope of the invention as defined in the appended claims.

What is claimed is:

1. Method for preparing a single crystal made of silicon in accordance with the Czochralski method, which method comprises:

pulling of a single crystal in a receiver from a melt having a surface provided in a crucible in the receiver, the single crystal being surrounded by a tubular to conical body, having a lower end which shields the crystal and divides the receiver chamber above the melt into an inner portion and an outer portion;

conducting an inert gas stream through the inner portion of the receiver chamber toward the surface of the melt and between the lower end of the body and the surface of the melt into the outer portion of the receiver chamber; and conducting a portion of the inert gas stream through at least one orifice in the body from the inner portion directly into the outer portion of the receiver chamber.

2. An apparatus for preparing a single crystal made of silicon according to the Czochralski method, comprising a receiver having a chamber which can be purged with an inert gas;

a crucible accommodated in said receiver for holding a melt having a surface;

a device for pulling a single crystal from the surface of the melt; and a tubular to conical body, said body having a lower end, which body shields a growing single crystal and divides the receiver chamber above the melt into an inner portion and an outer portion, inert gas which is conducted into the inner portion of the receiver chamber toward the melt passing between the lower end of the body and the surface of the melt into the outer portion of the receiver chamber;

wherein the body has at least one orifice through which inert gas is able to pass directly from the inner portion into the outer portion of the receiver chamber.

3. The apparatus as claimed in claim 2, wherein an orifice in the body is a slot which follows a perimeter of the body.

4. The apparatus as claimed in claim 2, further comprising an annular screen at the lower end of the body.

* * * * *

UNITED STATES PATENT AND TRADEMARK OFFICE
CERTIFICATE OF CORRECTION

PATENT NO.   : 5,578,123
DATED        : November 26, 1996
INVENTOR(S)  : VILZMANN ET AL It is certified that error appears in the above-identified patent and that said Letters Patent is hereby corrected as shown below:

Title page, column 1, item [73], change "Munich" to

--Burghausen--.

Signed and Sealed this

First Day of April, 1997

Attest:

BRUCE LEHMAN

Attesting Officer

Commissioner of Patents and Trademarks